US010802936B2

(12) United States Patent
Lesartre et al.

(10) Patent No.: US 10,802,936 B2
(45) Date of Patent: Oct. 13, 2020

(54) MEMORY LOCATION REMAPPING AND WEAR-LEVELLING

(71) Applicant: HEWLETT PACKARD ENTERPRISE DEVELOPMENT LP, Houston, TX (US)

(72) Inventors: Gregg B Lesartre, Fort Collins, CO (US); Ryan Akkerman, Plano, TX (US); Joseph F Orth, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 41 days.

(21) Appl. No.: 15/759,547

(22) PCT Filed: Sep. 14, 2015

(86) PCT No.: PCT/US2015/050036
§ 371 (c)(1),
(2) Date: Mar. 13, 2018

(87) PCT Pub. No.: WO2017/048228
PCT Pub. Date: Mar. 23, 2017

(65) Prior Publication Data
US 2019/0138411 A1 May 9, 2019

(51) Int. Cl.
G06F 11/20 (2006.01)
G06F 12/02 (2006.01)
(Continued)

(52) U.S. Cl.
CPC .......... G06F 11/2094 (2013.01); G06F 3/065 (2013.01); G06F 3/0616 (2013.01);
(Continued)

(58) Field of Classification Search
CPC ............. G06F 11/2094; G06F 11/1048; G06F 3/0607; G06F 3/0608; G06F 3/0613
See application file for complete search history.

(56) References Cited

U.S. PATENT DOCUMENTS 6,675,281 B1 * 1/2004 Oh ...................... G06F 12/0246
711/207
7,650,528 B2 * 1/2010 Rahman ................. G11C 29/02
714/3
(Continued)

OTHER PUBLICATIONS

Fan, J. et al., WL-Reviver: A Framework for Reviving any Wear-Leveling Techniques in the Face of Failures on Phase Change Memory, (Research Paper), Apr. 15, 2014, 12 Pages.
(Continued)

Primary Examiner — Nadeem Iqbal
(74) Attorney, Agent, or Firm — Park, Vaughan, Fleming & Dowler LLP

(57) ABSTRACT

In one example a system includes a memory, and at least one memory controller to: detect a failed first memory location of the memory, remap the failed first location of the memory to a spare second location of the memory based on a pointer stored at the failed first memory location, and wear-level the memory. To wear-level the memory, the memory controller may copy data from the spare second location of the memory to a third location of the memory, and keep the pointer in the failed first memory location.

13 Claims, 6 Drawing Sheets

(51) Int. Cl.
    *G06F 11/10*     (2006.01)
    *G06F 3/06*     (2006.01)
    *G11C 29/04*     (2006.01)

(52) U.S. Cl.
    CPC .......... *G06F 3/0619* (2013.01); *G06F 3/0659* (2013.01); *G06F 3/0673* (2013.01); *G06F 11/1048* (2013.01); *G06F 12/0238* (2013.01); *G06F 2201/82* (2013.01); *G06F 2212/1036* (2013.01); *G06F 2212/7201* (2013.01); *G06F 2212/7211* (2013.01); *G11C 2029/0409* (2013.01)

(56) References Cited

U.S. PATENT DOCUMENTS

| | | | |
|---|---|---|---|
| 7,689,762 B2 | 3/2010 | Hobson | |
| 8,176,238 B2 * | 5/2012 | Yu | G06F 3/061 711/103 |
| 8,266,367 B2 * | 9/2012 | Yu | G06F 3/0608 711/103 |
| 8,341,332 B2 * | 12/2012 | Ma | G06F 3/0613 711/103 |
| 8,572,466 B2 * | 10/2013 | Bueb | G06F 11/1048 714/764 |
| 8,601,202 B1 * | 12/2013 | Melcher | G11C 16/349 711/103 |
| 8,745,449 B2 * | 6/2014 | Dreifus | G11C 29/76 714/47.2 |
| 9,715,424 B1 * | 7/2017 | Ware | G11C 29/52 |
| 9,811,456 B2 * | 11/2017 | Roberts | G06F 12/0238 |
| 2004/0205289 A1 * | 10/2004 | Srinivasan | G06F 12/0246 711/103 |
| 2006/0179211 A1 * | 8/2006 | Aasheim | G06F 3/0619 711/103 |
| 2008/0320214 A1 * | 12/2008 | Ma | G06F 3/0613 711/103 |
| 2010/0281202 A1 * | 11/2010 | Abali | G06F 12/0246 711/103 |
| 2013/0013843 A1 | 1/2013 | Radovic et al. | |
| 2013/0013886 A1 | 1/2013 | Franceschini et al. | |
| 2014/0143593 A1 | 5/2014 | Strauss et al. | |
| 2015/0006816 A1 | 1/2015 | Gong | |

OTHER PUBLICATIONS

The International Search Report and the Written Opinion of the International Searching Authority, dated Jun. 29, 2016; International Application No. PCT/US2015/050036; 11 Pages.

Yoon, D.H. et al., Free-p: Protecting Non-volatile Memory Against Both Hard and Soft Errors, Dec. 12, 2010, 12 Pages.

Qureshi et al., "Enhancing Lifetime, and Security of PCM-Based Main Memory with Start-Gap Wear Leveling", 2009, IBM Research, pp. 14-23.

* cited by examiner

MEMORY LOCATION REMAPPING AND WEAR-LEVELLING

BACKGROUND

A computing system may include a number of memory modules. These memory modules may serve as system memory, which may store information for running programs and the like. These memory modules may serve also, in some situations, as longer term storage, to store information of the system, even after power cycles.

BRIEF DESCRIPTION OF THE DRAWINGS

The following detailed description references the drawings, wherein.

DETAILED DESCRIPTION

Figure 1:
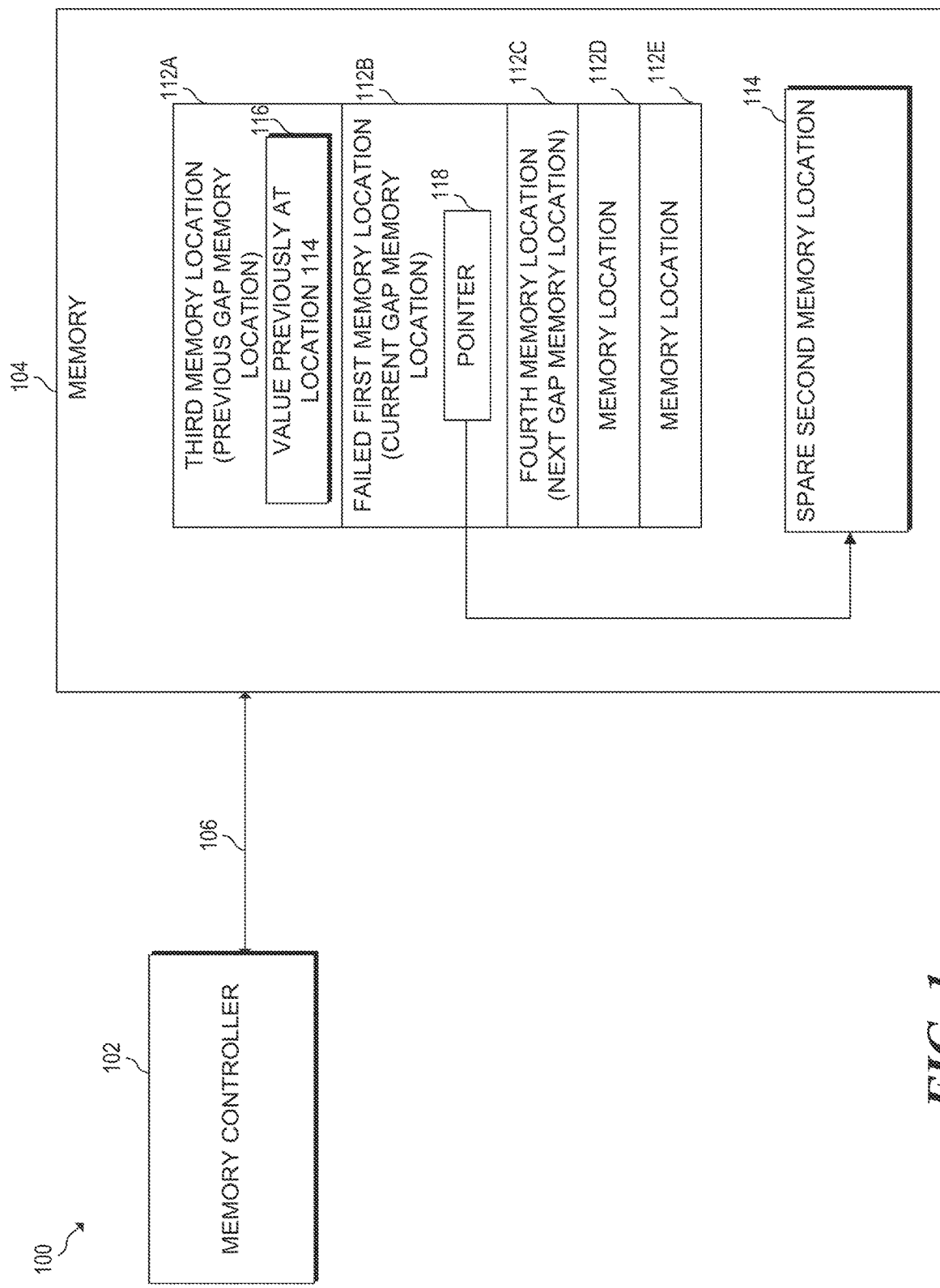
FIG. 1 is a block diagram of an example computing system for memory location remapping and wear-levelling.

A computing system may include volatile and/or non-volatile memories. Volatile memory loses its data after a power loss or reboot. Non-volatile memory retains data in the event of power loss or a reboot. Examples of volatile memories include dynamic random access memory (DRAM), static random access memory (SRAM), and the like. The non-volatile memory may be, for example, flash memory, memristor memory, phase change memory, or the like in various examples. To access a memory, a processor, such as a CPU (central processing unit), issues an access request for data at a particular logical (e.g., virtual) address. A memory controller translates the logical address requested by the processor to a physical memory location of the memory.

Various non-volatile memories, such as memristors or phase change random access memory (PCRAM), have a much lower limit on the number of times to which they can be written before failing as compared to DRAM, for example. Memory may also experience uneven access patterns. The uneven access patterns may result in physical memory locations that are accessed more than other physical memory locations. The uneven access patterns may lead to early wear-out of the more-frequently accessed memory locations. The uneven access patterns may be due to natural data hot spots or malicious codes.

This disclosure describes a combination of a wear-level engine that may prevent premature memory module wear-out by periodically the rotating physical memory location associated with a given logical address. However, even with wear-leveling, physical memory locations may fail, as not all physical memory components and/or locations may have exactly the same properties. To address memory location failure, a computing system may perform a memory remapping algorithm.

One example of a wear-leveling algorithm is "start-gap" wear leveling. Start-gap wear-leveling rotates the physical address associated with a given logical address. Start-gap wear-leveling physical addresses associated with a given logical address based on a start pointer and a gap pointer. The gap pointer points to a gap memory location of the memory, which cannot be read or written by the system. The memory controller creates a new gap at a different memory location after a specified number of writes to the memory region.

When the memory controller creates a new gap, the memory controller copies the data from the memory location of the new gap to the memory location of the previous gap. By periodically moving the gap to different physical memory locations, the wear-level engine evens out the frequency of writes among the memory locations of a wear-level region.

After the memory controller has assigned the gap pointer to each line in memory, the memory controller updates the value of the start pointer. The memory controller combines the value of the start pointer with a requested logical address, and the gap pointer to determine the physical memory location associated with the logical address.

As indicated above, a memory controller may use a memory remapping algorithm to handle failed memory locations. One example of a failed memory remapping algorithm is a so-called "FREE-p" remapping algorithm. A memory that implements FREE-p remapping maintains a "free pool" of spare memory locations reserved for the event of a failure of a memory location. Upon detection of a failed memory location, a remapping engine, which may be part of a memory controller or memory, stores a pointer at the failed memory location. The pointer at the failed memory location points to an address located in the free memory pool. The memory remapping engine reads the remap pointer from the failed memory location to determine the memory location of the free pool that contains data.

However, combining start-gap wear leveling with FREE-p failure remapping produces undesirable results. For example, after the wear-leveling engine creates a new gap at a failed memory location containing a remap pointer, the wear-leveling engine copies the remap pointer from the failed memory location to a previous gap memory location to fill the previous gap memory location. Copying the pointer from the failed memory location to the previous gap location would properly retain the pointer. However if the wear-level engine fills the gap at the failed memory location and creates a new gap at a different memory location, the failed memory location would become available for the memory controller to write. However, writing to the available failed memory location may not work at all, or may damage the failed memory location further due to the additional writes.

The techniques of this disclosure solve the issues of combining FREE-p failure remapping with start-gap wear leveling such that the two techniques are compatible with each other. As an example, a memory controller of a computing system configured in accordance with the techniques of this disclosure may detect a failed first memory location of a memory, remap the failed first memory location to a spare second memory location of the memory based on a pointer stored at the failed first memory location. The spare second memory location may be external to a wear-level region associated with the failed first memory location. The memory controller also properly wear-levels the memory.

Aspects of this disclosure also enable wear-leveling memory in the presence of a FREE-p remapped location. For example, the memory controller may copy data from the spare second memory location to a third memory location of the memory. The memory controller may further keep the pointer in the failed first memory location. When the memory controller creates a new gap at a fourth memory location, and fills a gap at the failed first memory location, the memory controller maintains the FREE-p pointer in the failed first memory location, and moves the value from the fourth memory location into the spare second memory location referenced by the FREE-p pointer.

FIG. 1 is a block diagram of an example computing system for memory location remapping with wear-levelling. FIG. 1 includes a computing system 100. System 100 may be any computing system or computing device capable of performing wear-leveling and remapping. System 100 may include at least one memory controller 102.

Memory controller 102 may be integrated within a central processing unit in some examples, and is coupled via a communication bus 106, to memory 104. Memory 104 may comprise a non-volatile memory, a volatile memory, or a combination thereof. Alternatively, Memory controller 102 may be independently implemented to interface to system components accessing memory 104. Examples of memory 104 may comprise DRAM, SRAM, non-volatile dynamic inline memory module(s) (NVDIMMs) a memristor-based memory, flash memory,) (Point memory, PCRAM, or the like in various examples. Memory 104 may comprise a wear-level region that includes physical memory locations 112A-112E (collectively "memory locations 112"). Memory locations 112 include failed first memory location 112B, third memory location 112A, and fourth memory location 112C. Memory 104 also includes second memory location 114. Second memory location 114 may comprise a spare memory location within a free pool of memory locations for failure remapping in some examples. The free pool may be external to the wear-level region of memory locations 112. Memory controller 102 may perform FREE-p remapping on memory locations 112 of memory 104.

A processor, such as a central processing unit (CPU), may generate requests to read or write memory 104. Memory controller 102 receives the read/write requests from the processor, and performs address translation. During address translation, memory controller 102 translates the logical address from a memory access request to a physical address that is associated with. The physical address may generally correspond to a particular memory location, such as one of memory locations 112.

In the example of FIG. 1, memory controller 102 may further perform wear-leveling based on start-gap wear-leveling. Start-gap wear-leveling creates a gap at a memory location of a wear-level region. For example, as part of start-gap wear-leveling, memory controller 102 may create a gap at one of memory locations 112. Memory controller 102 includes a start pointer and a gap pointer. The start pointer points to a memory location, for example third memory location 112A. The gap pointer points to a memory location that is the current gap.

As part of performing address translation, memory controller translates a logical address to a physical address associated with memory 104. Memory controller 102 further determines a particular memory location of memory 104 based on the start pointer and the gap pointer. As memory controller 102 moves the gap to different memory locations and updates the gap pointer accordingly, memory controller 102 also changes the memory location associated with a given logical address, which helps to even out access patterns across all of memory locations 112 of memory 104.

More particularly, memory controller 102 may determine the logical address based on the value of the start pointer and the value of the gap pointer, and the number of memory locations of memory 104. In the example of memory 104, memory locations 112 comprise five different memory locations 112A-112E. To determine which of memory locations 112 is associated with a particular logical address, memory controller 102 may calculate the physical address corresponding to one of physical locations 112 according to equation 1:

$$PA=(LA+Start) \bmod N \qquad (1),$$

where PA is the physical address, LA is the logical address, Start is the value of the start pointer, N is the total number of memory locations, and Mod denotes the modulus division operator. If the result of equation 1 is greater than or equal to the value of the gap pointer, memory controller 102 increments the value of PA from equation 1 by one, i.e. PA=PA+1, and the result is the physical address. Otherwise, the value of PA from equation 1 is the physical address.

Figure 2:
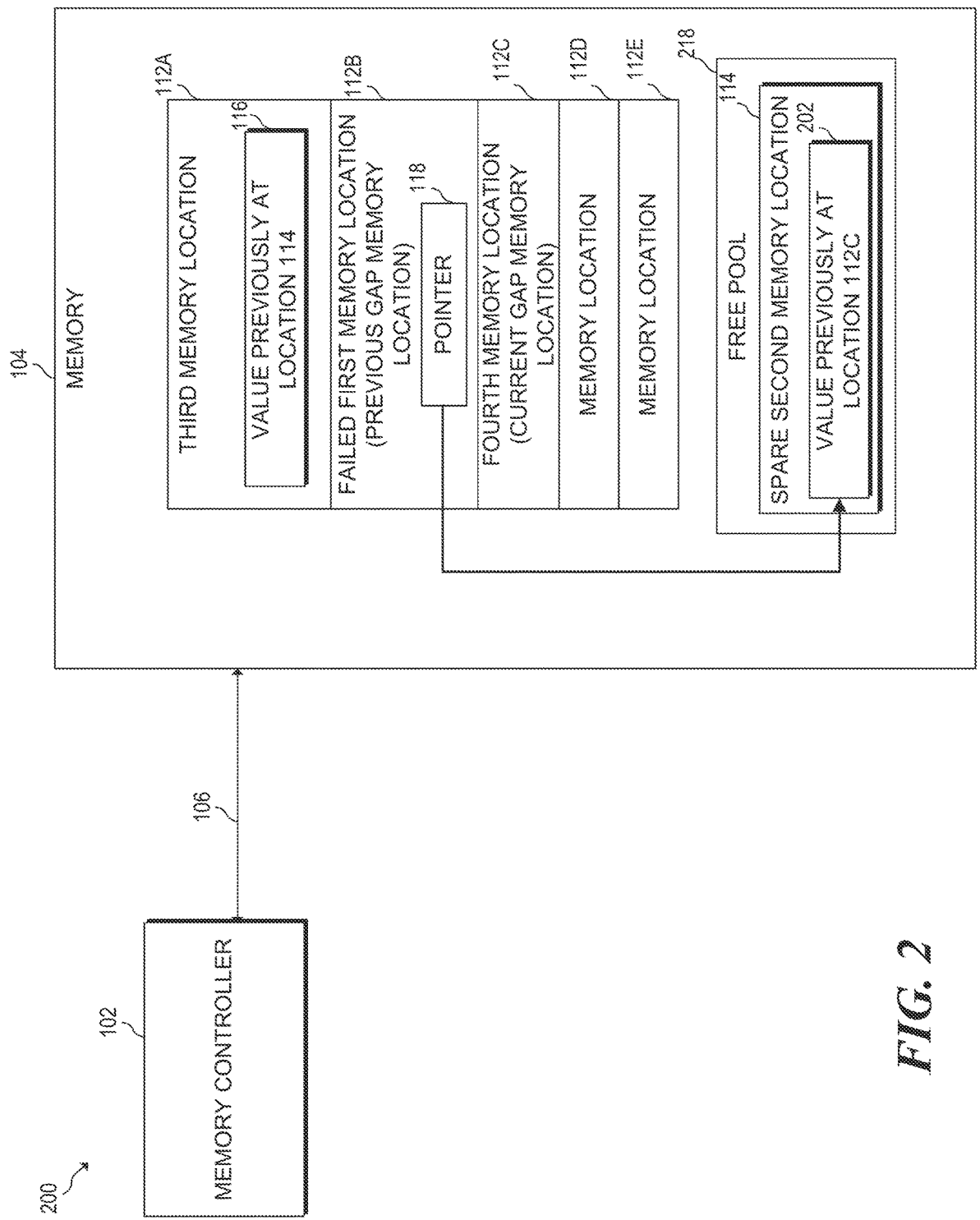
FIG. 2 is a block diagram of an example computing system for memory location remapping and wear-levelling.

Memory controller 102 also performs FREE-p remapping. Memory controller 102 performs FREE-p remapping by detecting a failed memory location. Memory controller 102 may detect a failed memory location using various error correcting codes (ECCs). Memory controller 102 writes ECC data during each write to memory locations 112. If memory controller 102 detects a failed memory location based on the associated ECC data, memory controller 102 may determine a replacement spare memory location within a pool of spare memory locations, such as free pool 218 (FIG. 2). Memory controller 102 writes a pointer at the failed location to remap the failed location to the spare location within a free pool of memory locations. The pointer indicates a memory location within the free pool of memory locations.

Memory controller 102 may use low latency ECC for most memory locations, which have few or no errors, and may use higher latency correction for blocks with multi-bit errors, e.g. to store a remap pointer at a failed memory location. If one of memory locations 112 has a threshold number of worn-out bits, memory controller 102 may raise an exception such that an operating system may remap the failed memory location, or memory controller 102 may remap the failed memory on its own.

Based on the ECC described above or other ECC, memory controller 102 may determine that a memory location, such as failed first memory location 112B, has failed. Responsive to determining that a memory location such as failed first memory location 112B, memory controller 102 may generally perform FREE-p remapping. When performing FREE-p remapping, memory controller 102 remaps failed first memory location 112B to another memory location within the open pool of memory locations, e.g. second memory location 114. To remap failed first memory location 112B, memory 104 may write pointer 118 to failed first memory location 112B.

In various examples, memory controller 102 may use an alternate ECC when storing pointers in a failed location. The alternate ECC used when storing remap pointers differs from the ECC used to store data at a non-failed memory location. The alternate ECC may use more bits than the ECC used to store data at a non-failed memory location. The result of using the alternate ECC when accessing remap pointer data is that the alternate ECC is capable of correcting far more bit errors to recover the correct the value of the pointer than for a non-failed memory location. Furthermore, memory controller 102 may use ECC algorithms that allow for fast error correction to reduce the performance impact of accessing a free-P remapped memory location.

In the example of FIG. 1, memory controller 102 may perform wear-leveling based on start-gap wear-leveling. To perform the techniques based on start-gap wear-leveling, memory controller 102 creates a gap corresponding at a memory location of memory 104. For example, memory controller 102 may create a gap at third memory location 112A. When a particular memory location is a gap, memory controller 102 does not write data to that memory location, and does not map a logical address to the memory location corresponding to the gap. Thus, in the example of FIG. 1, memory location 112A is unused while it is a gap memory location.

After a certain number of writes or accesses, memory controller 102 may create a new gap at a different memory location. In some examples, the new gap may be at an adjacent memory location relative to the previous gap. In other examples, the gap may move arbitrarily (i.e. not to an adjacent memory location). Once memory controller 102 creates a new gap, memory controller 102 copies data from the memory location of the new gap to the memory location of the previous gap, thus filling the memory location of the previous gap. In the example of FIG. 1 for instance, memory controller 102 creates a new gap at failed first memory location 112B. Memory controller 102 copies the data referenced by pointer 118, i.e. the data of spare second memory location 114 (116), to the previous gap, i.e. third memory location 112A. Memory controller 102 thereby fills the previous gap at third memory location 112A.

As described above, when a memory location has been remapped, memory locations, such as failed first memory location 112B, include a pointer to a memory location within the free pool of memory locations, e.g. pointer 118 to spare second memory location 114 in FIG. 1. Because failed first memory location 112B has failed or is failing, additional writes to failed first memory location 112B could cause additional damage to failed first memory location 112B and/or memory 104.

As will be illustrated in FIG. 2 in greater detail, after a number of writes, memory controller 102 eventually creates a new gap location at a memory location other than failed first memory location 112B, e.g. fourth memory location 112C. However, according to traditional start-gap wear leveling, moving the gap location from failed first memory location 112B to fourth memory location 112C would cause memory controller 102 to copy the data of fourth memory location 112C when filling the gap at failed first memory location 112B, resulting in a write to the failed memory location, which would be undesirable. Additionally, memory controller 102 could subsequently re-write failed first memory location 112B once the gap of failed memory location 112B is filled. As stated above, these additional writes to failed memory location 1128 could result in further degradation of failed first memory location 112B. Additionally, writing to failed first memory location 112B would result in the loss of pointer 118.

In the example of FIG. 1, the current gap location is failed first memory location 112B, and third memory location 112A is adjacent to failed first memory location 112B. FIG. 1 illustrates the state of memory 104 after the gap location has moved from third memory location 112A to failed first memory location 112B. In ordinary start-gap wear-leveling, memory controller 102 would move the contents of failed first memory location 112B (i.e. pointer 118) to the previous gap memory location, i.e. third memory location 112A.

According to aspects of this disclosure however, rather than copying the contents of failed first memory location 112B to memory location 112A, memory controller 102 may instead copy data of the location referenced by pointer 118, i.e. a value of second memory location 114 (116) to the previous gap memory location, i.e. third memory location 112A. Additionally, when filling a gap at a failed first memory location, e.g. failed first memory location 112B, memory controller 102 may keep pointer 118 in failed first memory location 112B and instead move data from fourth memory location 112C to second memory location 114, as will be illustrated in greater detail in FIG. 2.

FIG. 2 is a block diagram of an example computing system for non-volatile memory location remapping and wear-levelling. FIG. 2 includes computing system 200. System 200 is generally similar to system 100 of FIG. 1. In the example of FIG. 2, memory controller 102 has created a new gap at fourth memory location 112C and has filled the gap at failed first memory location 112B.

In an ordinary start-gap wear-leveling, memory controller 102 does not consider whether a gap memory location to be filled is remapped using FREE-p remapping. For example, if memory controller 102 were to fill the gap a failed first memory location 112B using ordinary start-gap wear-leveling, memory controller 102 would copy the data of fourth memory location 112C to failed first memory location 112B, which would overwrite pointer 118. Not only would the value of pointer 118 be lost, but failed first memory location 112B could incur additional writes, which would cause further damage to memory 104.

Instead, according to this disclosure, when filling a previous gap memory that has been FREE-p remapped, memory controller 102 copies the data from the newly-created gap memory location to the location referenced by the pointer of the previous gap memory location. In the example of FIG. 2, memory controller 102 copies the contents of fourth memory location 112C to the location referenced by pointer 118 of failed first memory location 112B, i.e. to second memory location 114 (202).

After creating a new gap at failed first memory location as illustrated in FIG. 2, memory controller 102 continues creating new gaps at different memory locations and filling the previous gap memory location after a number of writes. In some examples, memory controller 102 may create a new gap at adjacent memory locations, e.g. memory location 112D, followed by memory location 112E. In other examples, memory controller 102 may arbitrarily select a memory location at which to create a new gap. For example, memory controller 102 may use a Feistel network to randomize the memory locations at which new gaps are created. In other examples, memory controller 102 may use a random invertible binary matrix (RIB) or random bit shuffling (RBS) to randomize the memory locations at which gaps are created.

Figure 3:
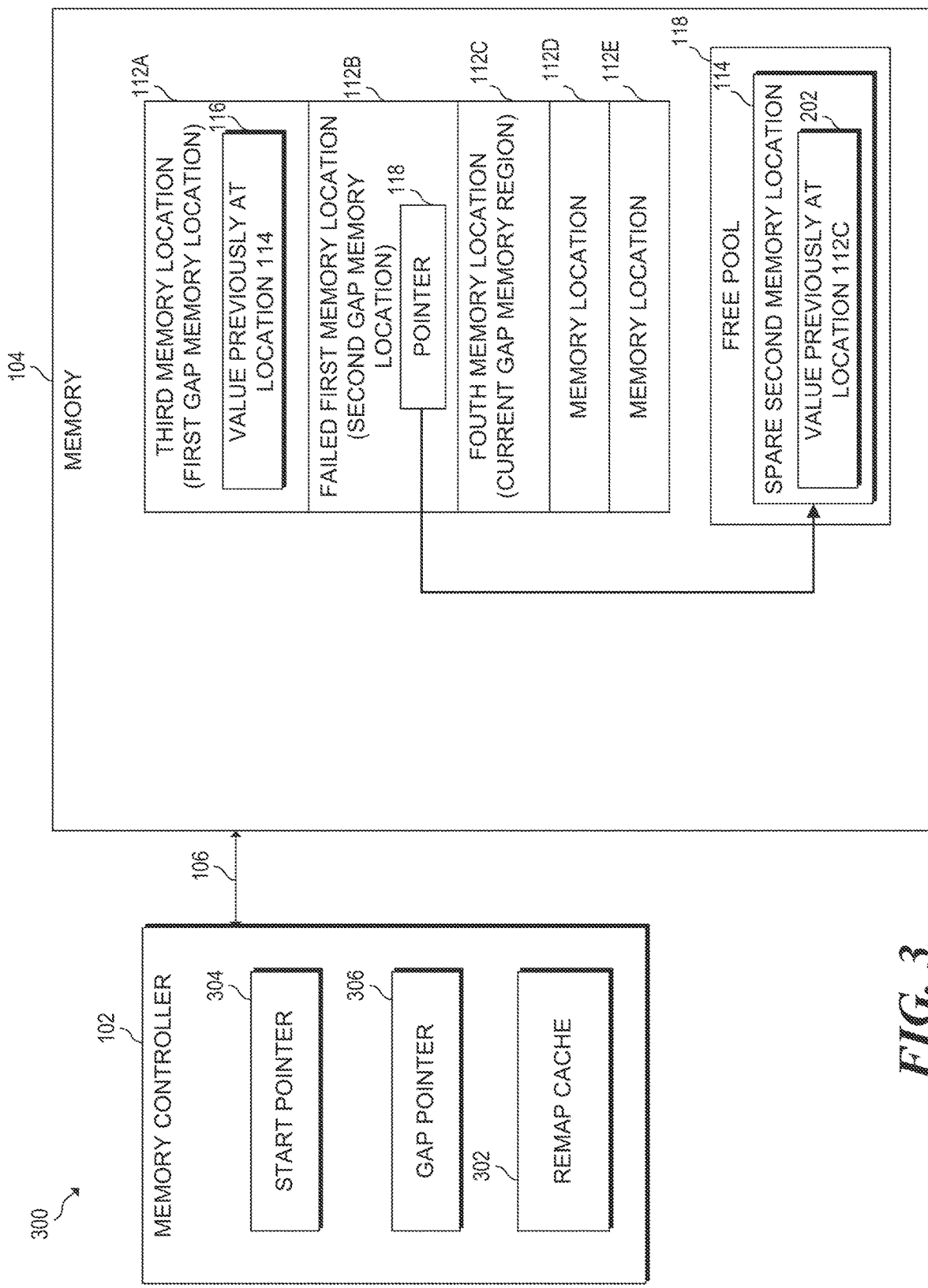
FIG. 3 is a block diagram of an example computing system for memory location remapping and wear-levelling.

FIG. 3 is a block diagram of an example computing system for performing memory location remapping and wear-levelling. FIG. 3 includes a computing system 300. FIG. 3 further illustrates the state of memory 104 after memory controller 102 has created and filled a first gap, created and filled a second gap, and created a third gap. FIG. 3 also illustrates additional details related to this disclosure.

In FIG. 3, memory controller 102 includes a start register 304 and gap register 306. Start register 304 and gap register 306 may store or comprise pointer values or addresses in various examples. Gap register 306 may comprise a reference to a current gap memory location, e.g. fourth memory location 112C in FIG. 3. After a certain number of writes, for example 100 writes, memory controller 102 creates a new gap at a different memory location of memory locations 112, and updates the value of gap register 306 to point to the new gap memory location. In the example of FIG. 3, memory controller 102 updates gap pointer to point to fourth memory location 112C after creating a new gap at fourth memory location 112C, Start register 304 also references a memory location of memory 104 for the purpose of performing start-gap wear leveling. Memory controller 102 updates (e.g., increments) the value of start register 304 after gap register 306 has been assigned to each of memory locations 112. Memory controller 102 determines an address of memory locations 112 based on a supplied logical address, the start register, and the gap register as described above.

In various examples, memory controller 102 may include a table comprising a plurality of start pointers, and a plurality of gap pointers rather than a single start pointer 304 and gap pointer 306. The plurality of start pointers and gap pointers may correspond to a plurality of wear-leveled regions.

In some examples, when memory controller 102 reads from one of memory locations 112, non-volatile memory may check the one of memory locations 112 being accessed to determine if a remap indication, such as a bit, is present. If the remap indication is present, memory 104 may determine that a remap pointer is present at the memory location, e.g. pointer 118 of failed first memory location 112B. Responsive to determining that the remap indication is set, memory controller 102 location reads the remap pointer to determine the address to which the memory location has been remapped.

In the example of FIG. 3, memory controller 102 may attempt to access (i.e. read or write) failed memory location 112B. Responsive to receiving the access request, non-volatile memory controller 102 may read that a remap indication of failed first memory location 112B is set. Responsive to reading the set remap indication, memory controller 102 reads pointer 118, which references second memory location 114. Memory controller 102 then accesses second memory location 114 based on pointer 118.

Memory controller 102 may also include remap cache 302. Remap cache 302 may include entries corresponding at least one memory location that has a remap pointer, such as pointer 118. Memory controller 102 may check remap cache 302 when performing an access to one of memory location 112. If remap cache 302 includes an entry corresponding to the memory location being accessed, memory controller 102 determines that the memory location being accessed has been remapped. Each entry of remap cache 302 may include a remap pointer to the memory location to which the indexed memory location refers. Memory controller 102 reads the remap pointer from remap cache 302 rather than having to read a pointer stored in a failed memory location, e.g. pointer 118 of failed first memory location 112B.

In some examples, the location referenced by remap pointer 118, e.g. spare second memory location 114 of free pool 218, may fail. In this case, memory controller 102 may replace remap pointer 118 with a new pointer that refers to a different spare memory location of free pool 218.

Figure 4:
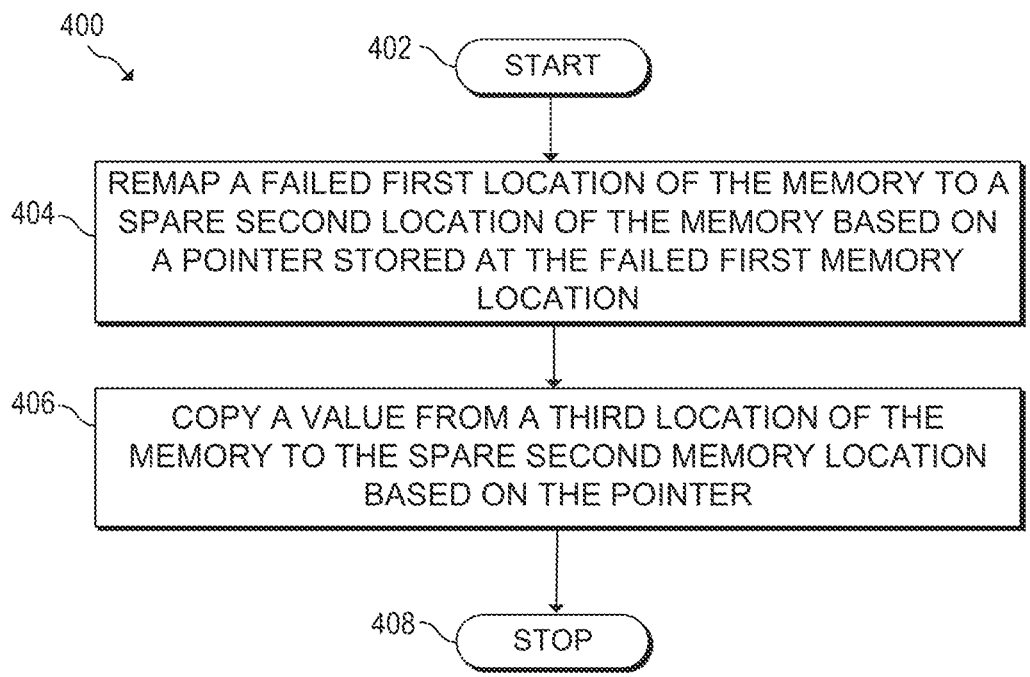
FIG. 4 is a flowchart of an example method for memory location remapping and wear-levelling.

FIG. 4 is a flowchart of an example method 400 for memory location remapping and wear-levelling. Method 400 may be described below as being executed or performed by a system, for example, system 100 of FIG. 1 or system 200 of FIG. 2. Other suitable systems and/or computing devices may be used as well. Method 400 may be implemented in the form of executable instructions stored on at least one machine-readable storage medium of the system and executed by at least one processor of the system. Alternatively or in addition, method 400 may be implemented in the form of electronic circuitry (e.g., hardware). In alternate examples of the present disclosure, one or more blocks of method 400 may be executed substantially concurrently or in a different order than shown in FIG. 4. In alternate examples of the present disclosure, method 400 may include more or less blocks than are shown in FIG. 4. In some examples, one or more of the blocks of method 400 may, at certain times, be ongoing and/or may repeat.

Method 400 may start at block 402 and continue to block 404, where the system may remap a failed first location of the memory to a spare second location of the memory based on a pointer stored at the failed first memory location. Additionally, the system may wear-level the memory, e.g. memory 104. To wear-level memory 104, the system may proceed to block 406. At block 406, the system may copy a value from a third location of the memory to the spare second memory location based on the pointer. The system may then proceed to block 408, where method 400 may stop.

Figure 5:
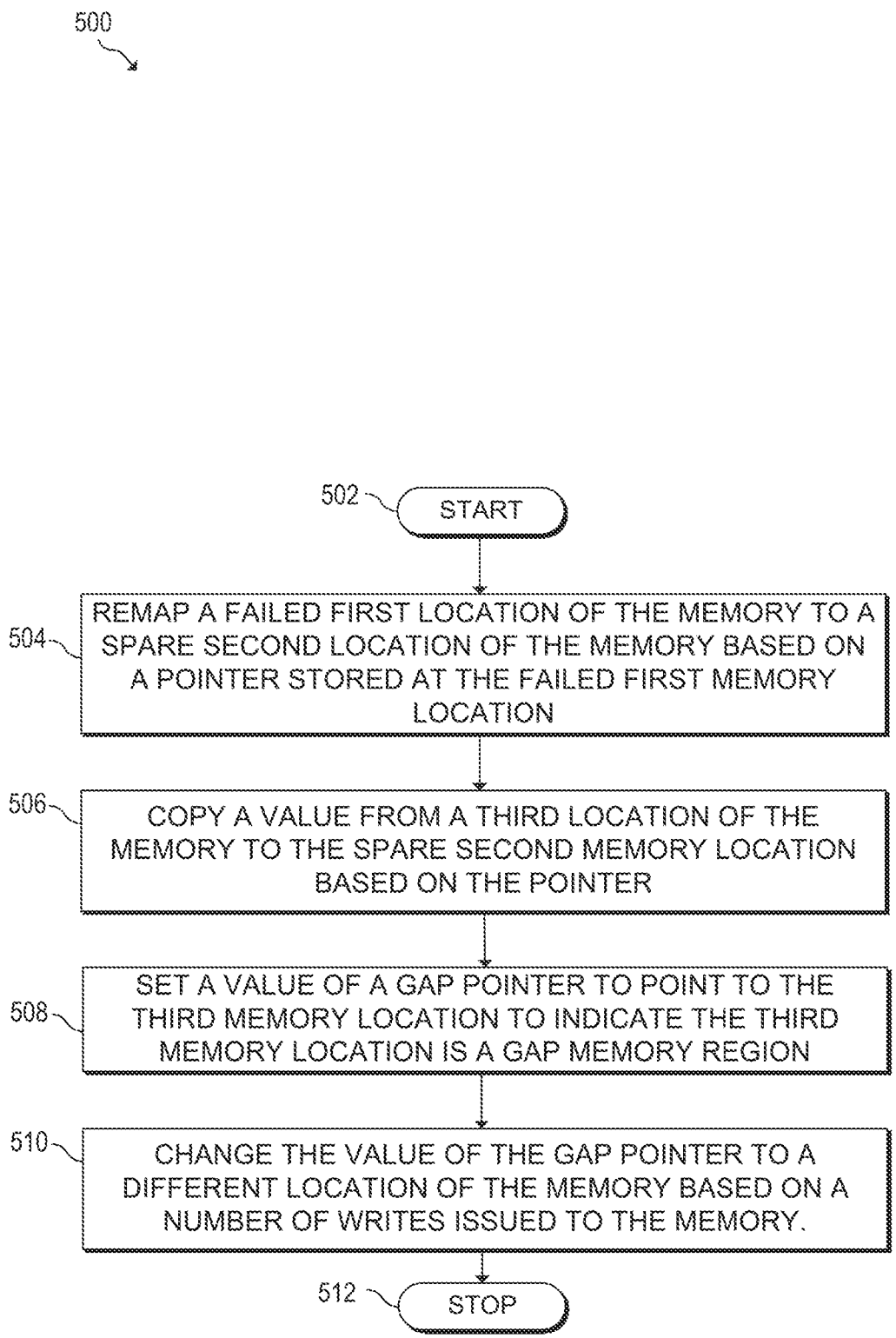
FIG. 5 is a flowchart of an example method for wear-leveling and failure remapping a memory.

FIG. 5 is a flowchart of an example method 500 for memory wear-leveling and failure remapping. Method 500 may be described below as being executed or performed by a system, for example, system 100 of FIG. 1 or system 200 of FIG. 2. In some examples, memory controller 102 may perform some or all of the blocks of method 500. Other suitable systems and/or computing devices may be used as well. Method 500 may be implemented in the form of executable instructions stored on at least one machine-readable storage medium of the system and executed by at least one processor of the system. Alternatively or in addition, method 500 may be implemented in the form of electronic circuitry (e.g., hardware). In alternate examples of the present disclosure, one or more blocks of method 500 may be executed substantially concurrently or in a different order than shown in FIG. 5. In alternate examples of the present disclosure, method 500 may include more or less blocks than are shown in FIG. 5. In some examples, one or more of the blocks of method 500 may, at certain times, be ongoing and/or may repeat.

Method 500 may start at block 502 and continue to block 504, where the system remap a failed first location of the memory, e.g. failed first memory location 112B, to a spare second location of the memory, e.g. spare second memory 114, location based on a pointer (e.g., pointer 118) stored at the failed first memory location. Additionally, the system may wear-level the non-volatile memory. To wear-level memory 104, the system may proceed to block 506.

At block 506, the system may copy a value from a third location (e.g., fourth memory location 112C) of the memory to the spare second memory location based on the pointer. In various examples, to copy a value from a third memory location to the second memory location based on the pointer, the system may read a cached copy of the pointer from a remap cache entry of a memory controller. In various examples, the third memory location may comprise a gap memory location that cannot be written. The third memory location may also be adjacent to the first memory location in some examples.

At block 508, responsive to moving the value from the third memory location to the second memory location, the system may set a value of a gap pointer to point to the third memory location to indicate the third memory location is a gap memory location.

The third memory location may be adjacent to the failed first memory location in various examples. The system may then proceed to block 508 and indicate the third memory location is the gap memory location and the failed first memory location is not the gap location. In some examples, the gap memory location cannot be written.

The system may further proceed to block 510 at which the system may indicate the second memory location is the gap location and the third memory location is not the gap location. The system may continue to block 512 at which point, the system may change the value of the gap pointer to a different location of the memory based on a number of writes issued to the memory. Method 500 may eventually continue to block 512, where method 500 may stop.

Figure 6:
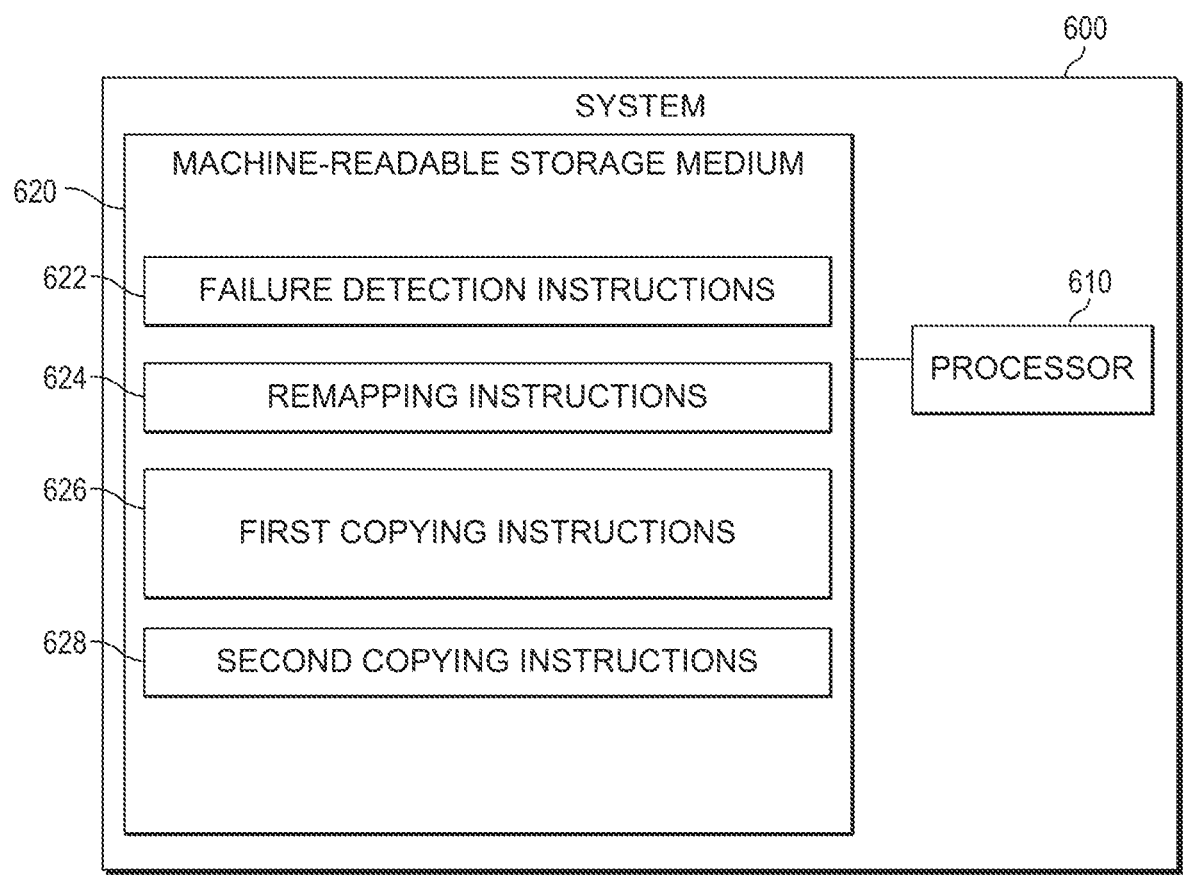
FIG. 6 is a block diagram of an example system for wear-leveling and failure remapping of a memory.

FIG. 6 is a block diagram of an example system for wear-leveling and failure remapping a memory. System 600 may be similar to system 100 of FIG. 1 or system 200 of FIG. 2, for example. In the example of FIG. 6, system 600 includes a processor 610 and a machine-readable storage medium 620. Although the following descriptions refer to a single processor and a single machine-readable storage medium, the descriptions may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 610 may be one or more central processing units (CPUs), microprocessors, and/or other hardware devices suitable for retrieval and execution of instructions stored in machine-readable storage medium 620. In the particular examples shown in FIG. 6, processor 610 may fetch, decode, and execute instructions 622, 624, 626, 628 to perform wear-leveling and failure remapping of a non-volatile memory. As an alternative or in addition to retrieving and executing instructions, processor 610 may include one or more electronic circuits comprising a number of electronic components for performing the functionality of one or more of the instructions in machine-readable storage medium 620. With respect to the executable instruction representations (e.g., boxes) described and shown herein, it should be understood that part or all of the executable instructions and/or electronic circuits included within one box may, in alternate examples, be included in a different box shown in the figures or in a different box not shown.

Machine-readable storage medium 620 may be any electronic, magnetic, optical, or other physical storage device that stores executable instructions. Thus, machine-readable storage medium 620 may be, for example, Random Access Memory (RAM), an Electrically-Erasable Programmable Read-Only Memory (EEPROM), non-volatile memory, a storage drive, an optical disc, and the like. Machine-readable storage medium 620 may be disposed within system 600, as shown in FIG. 6. In this situation, the executable instructions may be "installed" on the system 600.

Alternatively, machine-readable storage medium 620 may be a portable, external or remote storage medium, for example, that allows system 600 to download the instructions from the portable/external/remote storage medium. In this situation, the executable instructions may be part of an "installation package". As described herein, machine-readable storage medium 620 may be encoded with executable instructions for partial backup during runtime for memory modules with volatile memory and non-volatile memory.

Referring to FIG. 6, failure detection instructions 622, when executed by a processor (e.g., 610), may cause system 600 to detect a failed first location of the memory based on error correcting code (ECC) data associated with accessing the failed first memory location. Remapping instructions 624, when executed by a processor (e.g., 610), may cause system 600 to remap a value from a failed first memory location of the memory to a spare second memory location of the memory based on a pointer stored at the failed first memory location. First copying instructions 626, when executed by a processor (e.g., 610), may cause system 600 to wear-level the non-volatile memory. To wear-level the non-volatile memory, system 600 may copy a value from the second memory location to a third location of the memory. Second copying instructions 628, when executed by a processor (e.g., 610), may cause system 600 to copy a value of the fourth memory location to the second memory location. In various examples, the spare second memory location may one of a plurality of spare memory locations external to a wear level region comprising the failed first memory location, the third memory location, and the fourth memory location.

The invention claimed is:

1. A system comprising:
a memory; and
at least one memory controller to:
store, in a remap cache entry of the at least one memory controller, an address associated with a first memory location of the memory and a remap pointer;
detect a failure of the first memory location of the memory;
read the remap cache entry to determine, based on the remap pointer, an address of a spare second memory location;
remap the failed first location of the memory to the spare second memory location based on the remap pointer; and
wear-level the memory, by:
copying data from the spare second location of the memory to a third location of the memory; and
keeping a pointer stored at the failed first memory location in the failed first memory location.

2. The system of claim 1, wherein to wear-level the memory, the at least one memory controller further to:
copy data from a fourth memory location of the memory to the second memory location.

3. The system of claim 1, wherein the failed first memory location comprises
a gap location, and wherein the third memory location comprises a previous gap
memory location.

4. The system of claim 1, wherein the at least one memory controller further to:
determine that the failed first memory location is remapped based on a remap indication stored in the failed first memory location.

5. The system of claim 1,
wherein the failed first memory location comprises a gap memory location, and wherein the third memory location comprises a previous gap memory location,
wherein the at least one memory controller further comprises a gap pointer, the at least one memory controller further to:
change a value of the gap pointer from an address of the third memory location to the failed first memory location responsive to copying the data from the spare second memory location to the third memory location.

6. The system of claim 5, wherein the at least one memory controller further comprises a start pointer corresponding a memory location of the memory,
the at least one memory controller further to:
determine a location of the memory based on a logical address, a value of the start pointer, and a value of the gap pointer; and change the value of the start pointer responsive to assigning the gap pointer to every memory location of the memory.

7. A method for wear-leveling and failure remapping a memory, the method comprising:
remapping a failed first location of the memory to a spare second location of the memory based on a pointer stored at the failed first memory location; and
wear-leveling the memory, wherein wear-leveling the memory comprises:
copying a value from a third location of the memory to the spare second memory location based on the pointer, by reading a cached copy of the pointer from a remap cache entry of a memory controller.

8. The method of claim 7, wherein the third memory location comprises a gap memory location that cannot be accessed.

9. The method of claim 7, wherein the third memory location is adjacent to the failed first memory location.

10. The method of claim 7, further comprising:
responsive to moving the value from the third memory location to the second memory location, setting a value of a gap pointer to point to the third memory location to indicate the third memory location is a gap memory region.

11. The method of claim 10, further comprising changing the value of the gap pointer to a different location of the memory based on a number of writes issued to the memory.

12. A non-transitory machine-readable storage medium encoded with instructions for wear-leveling and failure remapping a memory, the instructions executable by a processor of a system to cause the system to:
store, in a remap cache entry of a memory controller of the system, an address associated with a first memory location of the memory and a remap pointer;
detect a failure of the first location of the memory based on error correcting code (ECC) data associated with accessing the failed first memory location;
read the remap cache entry to determine, based on the remap pointer, an address of a spare second memory location;
remap a value from a failed first memory location of the memory to the spare second memory location of the memory based on a the remap pointer; and
wear-level the memory, by:
copying a value from the second memory location to a third location of the memory, and
copying a value of a fourth memory location to the second memory location.

13. The non-transitory machine-readable storage medium of claim 12,
wherein the spare second memory location is one of a plurality of spare memory locations external to a wear level region comprising the failed first memory location, the third memory location, and the fourth memory location.

* * * * *